(12) United States Patent
Takizawa et al.

(10) Patent No.: US 8,072,759 B2
(45) Date of Patent: Dec. 6, 2011

(54) ELECTRONIC DEVICE

(75) Inventors: Minoru Takizawa, Sagamihara (JP);
Takahisa Funayama, Musashino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/732,037

(22) Filed: Mar. 25, 2010

(65) Prior Publication Data

US 2010/0309628 A1     Dec. 9, 2010

(30) Foreign Application Priority Data

Jun. 3, 2009   (JP) ................................ 2009-134350

(51) Int. Cl.
*H05K 7/20*     (2006.01)

(52) U.S. Cl. ........ 361/704; 361/719; 257/706; 257/712; 165/80.3

(58) Field of Classification Search .................. None
See application file for complete search history.

(56) References Cited

U.S. PATENT DOCUMENTS

| | | | | | |
|---|---|---|---|---|---|
| 5,883,430 | A | * | 3/1999 | Johnson | 257/706 |
| 5,891,753 | A | * | 4/1999 | Akram | 438/108 |
| 5,898,224 | A | * | 4/1999 | Akram | 257/778 |
| 6,410,988 | B1 | * | 6/2002 | Caletka et al. | 257/778 |
| 6,441,485 | B1 | * | 8/2002 | Glenn | 257/727 |
| 6,486,554 | B2 | * | 11/2002 | Johnson | 257/738 |
| 6,617,684 | B2 | * | 9/2003 | Akram et al. | 257/712 |
| 6,933,619 | B2 | * | 8/2005 | Caletka et al. | 257/796 |
| 7,081,678 | B2 | * | 7/2006 | Liu | 257/706 |
| 7,091,060 | B2 | * | 8/2006 | Bolken et al. | 438/106 |
| 7,202,556 | B2 | * | 4/2007 | 'Khng et al. | 257/687 |
| 7,629,203 | B2 | * | 12/2009 | Suh et al. | 438/122 |
| 7,782,620 | B2 | * | 8/2010 | Tomioka et al. | 361/704 |

FOREIGN PATENT DOCUMENTS

| | | |
|---|---|---|
| JP | 63-181396 A | 7/1988 |
| JP | 06-302727 A | 10/1994 |
| JP | 08-222671 | 8/1996 |
| JP | 08-222671 A | 8/1996 |
| JP | 09-017827 A | 1/1997 |
| JP | 09-306954 A | 11/1997 |
| JP | 04-122053 | 9/2001 |
| JP | 2005-032796 A | 2/2005 |
| JP | 2008-166377 | 7/2008 |
| JP | 2008-166377 A | 7/2008 |
| JP | 2008-311458 A | 12/2008 |

OTHER PUBLICATIONS

Notice of Reasons for Rejection mailed by Japan Patent Office on Jun. 1, 2010 in the corresponding Japanese patent application No. 2009-134350.

Notice of Reasons for Rejection mailed by Japan Patent Office on Sep. 28, 2010 in the corresponding Japanese patent application No. 2009-134350.

* cited by examiner

*Primary Examiner* — Boris Chervinsky

(74) *Attorney, Agent, or Firm* — Knobbe, Martens, Olson & Bear LLP

(57) ABSTRACT

According to one embodiment, an electronic device includes a printed circuit board housed in a housing, a surface mount part soldered to the printed circuit board, a cooling mechanism which covers the surface mount part from an opposite side to the printed circuit board, a reinforcing portion formed by supplying an adhesive to an outer peripheral edge of the surface mount part and the printed circuit board such as to be across each other, which reinforces a solder joint portion provided between the surface mount part and the printed circuit board and a spacer formed of the adhesive, which is set between the surface mount part and the cooling mechanism and supports the cooling mechanism.

7 Claims, 6 Drawing Sheets

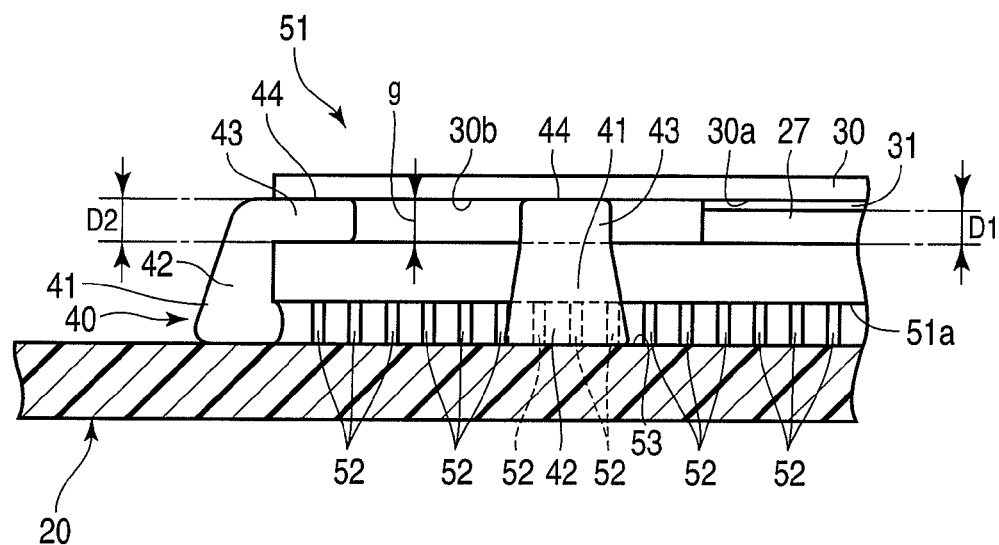
F I G. 6
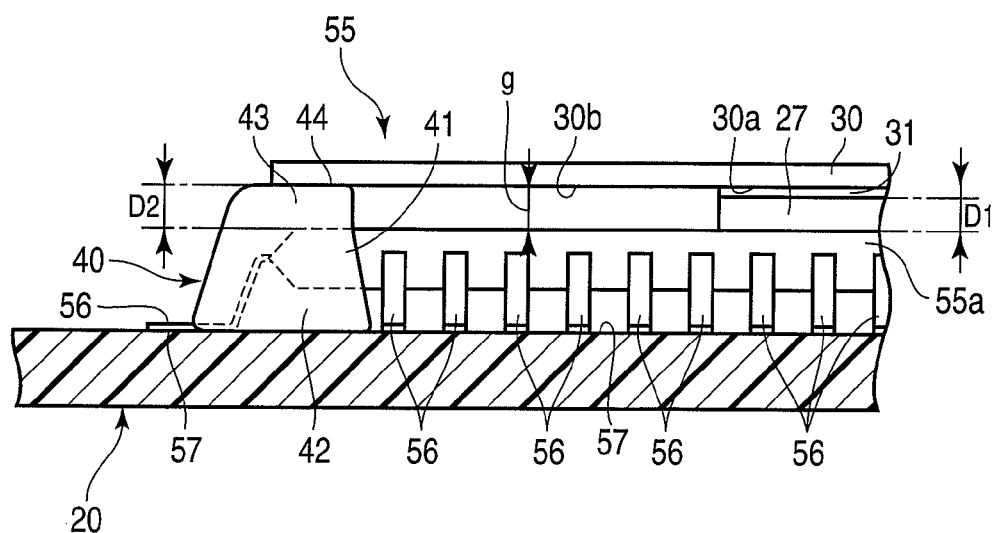
F I G. 7

100
ELECTRONIC DEVICE

CROSS-REFERENCE TO RELATED APPLICATIONS

This application is based upon and claims the benefit of priority from Japanese Patent Application No. 2009-134350, filed Jun. 3, 2009, the entire contents of which are incorporated herein by reference.

BACKGROUND

1. Field

One embodiment of the present invention relates to an electronic device, for example, which contains a printed circuit board in which soldered jointed portions of parts mounted on a surface of the board are reinforced with an adhesive.

2. Description of the Related Art

Electronic devices such as personal computers employ surface mount parts, for example, a ball grid array (BGA) in order to increase the package density of the printed circuit board. In the case where surface mount parts of this type are mounted on a printed circuit board, a coating agent or the like is applied on surface mount parts and the printed circuit board to be across over them in some cases for the protection of the jointed parts as discussed in Jpn. Pat. Appln. KOKAI Publication No. 4-122053.

In order to reinforce a solder jointed portion between a surface mount portion and a printed circuit board, which is weak to a stress caused by impulse, for example, a thermosetting adhesive is used. The adhesive is supplied to the outer circumferential edge of the surface mount part and the printed circuit board to be across over them, and then cured. In this matter, the adhesive reinforces the solder joint between the surface mount part and the printed circuit board, and thus the disconnection of the solder joint can be prevented.

In some cases, a surface mount part such as BGA is mounted on a substrate in such a state where a chip, which generates heat, is exposed. In order to cool down such a chip, a cooling mechanism such as a heat sink is provided for the surface mount part, and thus the part is thermally connected to the chip. The cooling mechanism is positioned to have a gap between the chip and itself. This gap is then filled with a grease having a heat conductivity.

If inclined or brought into direct contact with a chip, the cooling mechanism may damage the chip. In order to avoid this, a spacer is provided for the substrate of the surface mount part in order to maintain the gap between the cooling mechanism and the chip. The spacer is, for example, a rectangular-shaped part formed of a resin. The spacer maintains the gap between the cooling mechanism and the chip appropriately, and thus prevents the chip from being damaged due to the inclining of or direct contact by the cooling mechanism.

However, at the same time, it requires the excessive work to mount the spacer to the substrate of the surface mount part. Further, the spacer is required although it is not directly related to the performance of the surface mount part, and thus the number of parts is increased, which causes a higher production cost of the electronic device.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 6 is an exemplary cross sectional view of a mount structure of a PGA according to the fourth embodiment; and FIG. 7 is an exemplary cross sectional view of a mount structure of a QFP according to the fifth embodiment.

DETAILED DESCRIPTION

Various embodiments according to the invention will be described hereinafter with reference to the accompanying drawings. In general, according to one embodiment of the invention, an electronic device includes a printed circuit board housed in a housing, a surface mount part soldered to the printed circuit board, a cooling mechanism which covers the surface mount part from an opposite side to the printed circuit board, a reinforcing portion formed by supplying an adhesive to an outer peripheral edge of the surface mount part and the printed circuit board such as to be across each other, which reinforces a solder joint portion provided between the surface mount part and the printed circuit board and a spacer formed of the adhesive, which is set between the surface mount part and the cooling mechanism and supports the cooling mechanism.

The first embodiment of the present invention will now be described with reference to FIGS. 1 to 3.

Figure 1:
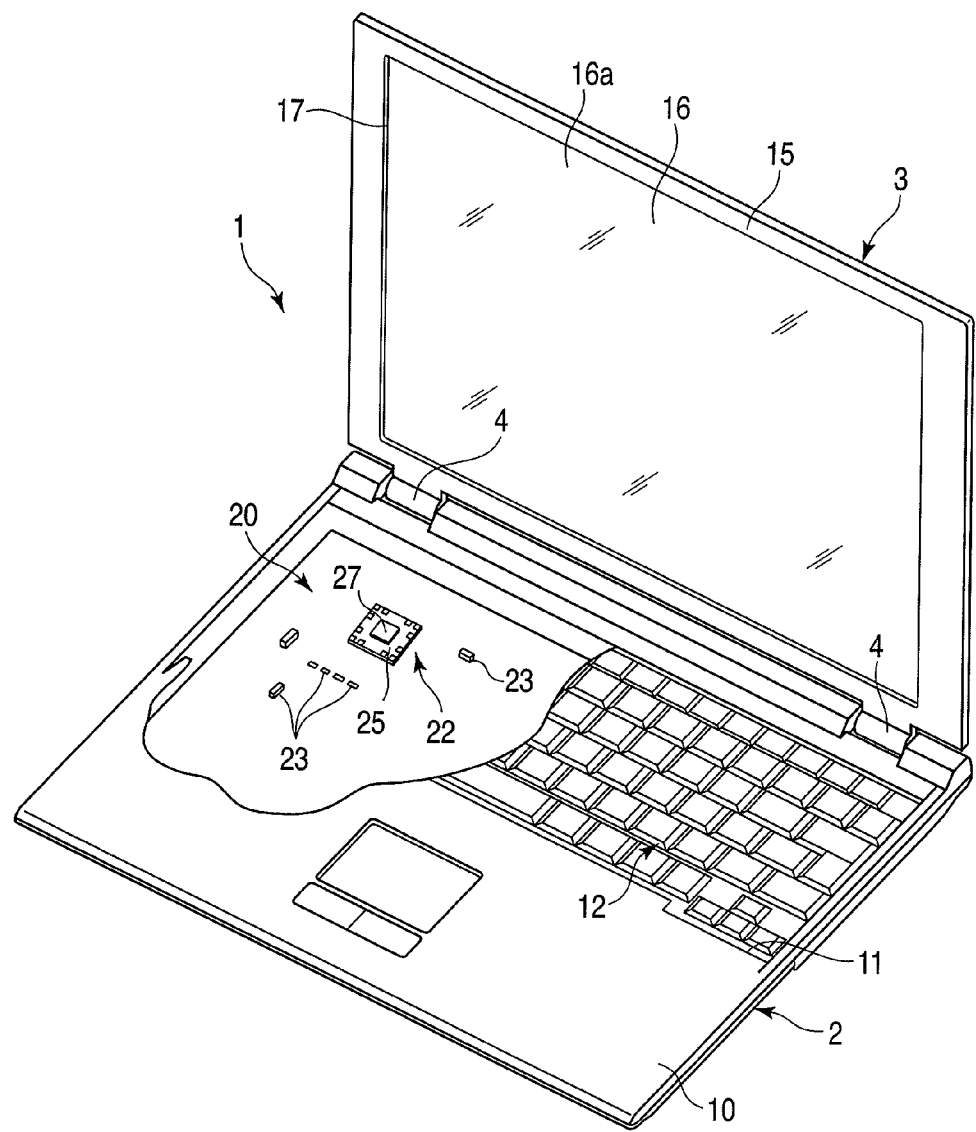
FIG. 1 is an exemplary partially cut-away perspective view of a portable computer according to the first embodiment.

FIG. 1 shows an example of the electronic device, that is, a portable computer 1. The portable computer 1 includes a main body 2 of the computer and a display module 3.

The display module 3 is jointed to a rear end of the main body 2 via a pair of hinge portions 4. The display module 3 is made pivotable between a closed position where the module is lied on the main body 2 of the computer and an open position where the module stands upright from the rear end of the main body 2 around the hinge portions 4 as axis.

The main body 2 of the computer includes a housing 10 having a flat box shape. A keyboard mount portion 11 is formed on the upper surface of the housing 10. A keyboard 12 is supported on the keyboard mount portion 11.

The display module 3 includes a display housing 15 having a flat box shape, and a liquid crystal display panel 16 housed in the display housing 15. A liquid display panel 16 includes a screen 16a. The screen 16a is exposed to the outside of the display module 3 through an opening 17 opened in the front surface of the display housing 15.

A printed circuit board 20 is housed in the housing 10. As shown in FIG. 1, a BGA 22, which is an example of the surface mount parts, and electronic parts 23 such as capacitors and resistors are mounted on the printed circuit board 20.

Figure 2:
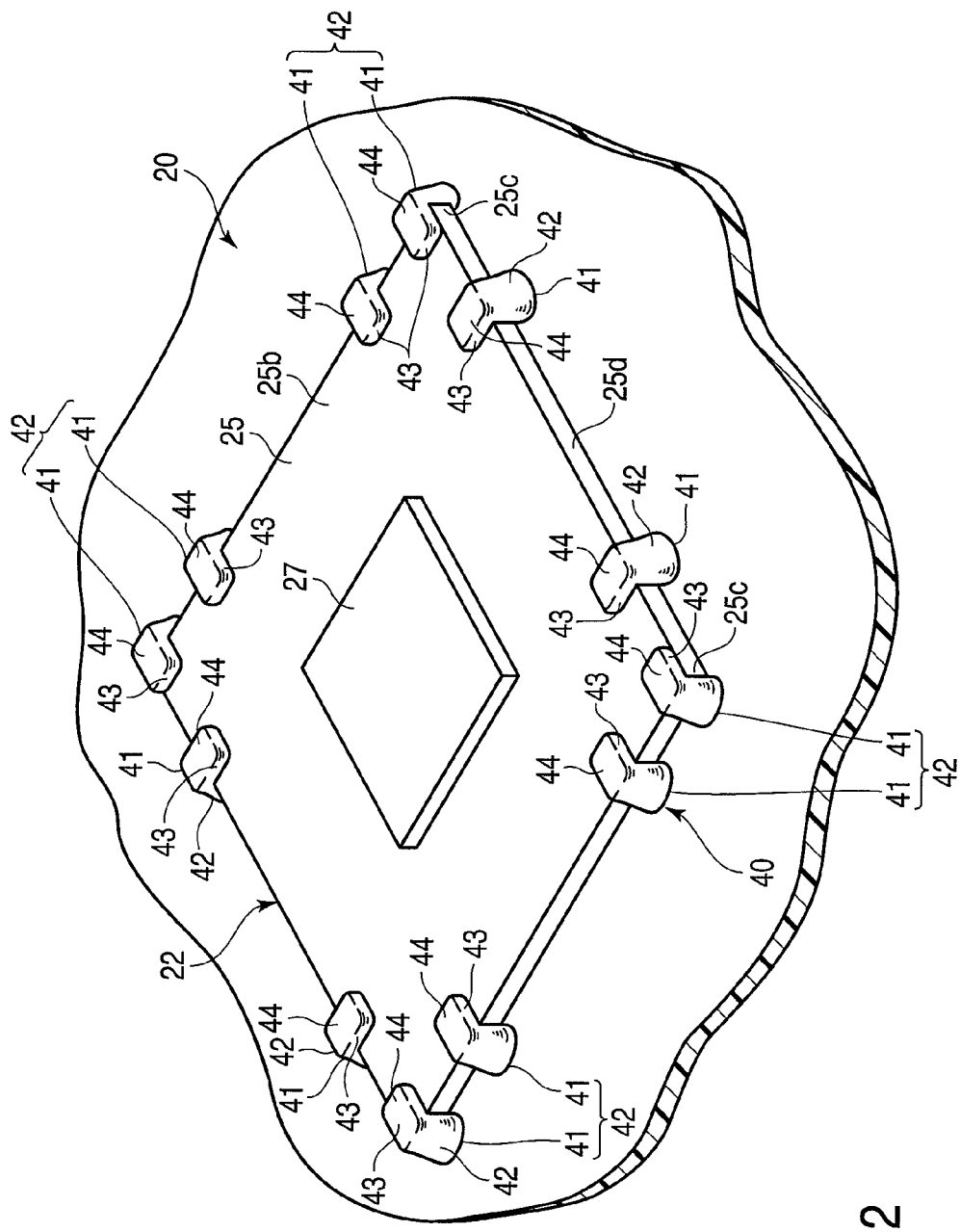
FIG. 2 is an exemplary perspective view of a BGA mounted on the printed circuit board in the first embodiment.
Figure 3:
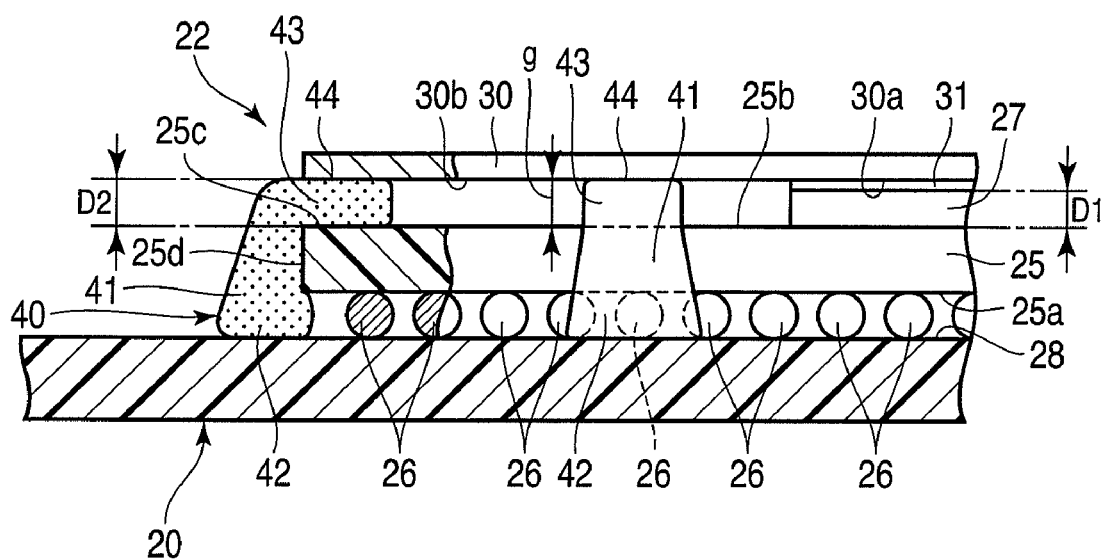
FIG. 3 is an exemplary cross sectional view of a part of the BGA in the first embodiment as viewed from side.

As shown in FIGS. 2 and 3, the BGA 22 includes a rectangular substrate 25, a plurality of solder balls 26 and a bare chip 27. The substrate 25 includes a first surface 25a which faces the printed circuit board 20, a second surface 25b located on an opposite side to the first surface 25a, and four corner portions 25c. It should be noted here that the shape of the substrate 25 is not limited to rectangular, but it may be some other polygonal such as octagonal.

The solder balls 26 are an example of connection terminals, and they are arranged in a lattice manner on the first surface 25a of the substrate 25. The solder balls 26 are soldered to a conductor pattern (not shown in the figure) of the substrate 25. The bare chip 27 generates heat while the portable computer 1 is operating. The bare chip 27 is mounted on the second surface 25b of the substrate 25.

As shown in FIG. 3, a heat sink 30 is mounted on the BGA 22. The heat sink is an example of the cooling mechanism. The heat sink 30 is placed on the second surface 25b of the substrate 25 such as to cover the bare chip 27.

The heat sink 30 includes a first region 30a and a second region 30b. The first region 30a faces the bare chip 27. The second region 30b surrounds the first region 30a and also faces the second surface 25b of the substrate 25.

Between the first region 30a and the bare chip 27, a grease 31 having a heat conductivity is filled. With this structure, the heat sink 30 and the bare chip 27 are thermally connected to each other via the grease 31. The heat generated by the bare chip 27 is propagated to the heat sink 30 via the grease 31 and radiated from the heat sink 30.

The BGA 22 includes reinforcing members 40 which reinforces a solder joint portion 28 between each of the solder balls 26 and the conductive pattern of the printed circuit board 20. The reinforcing members 40 is a cured adhesive, and includes a reinforcing portion 42 formed between the outer peripheral edge 25d of the substrate 25 and the printed circuit board 20 to be across over them.

The reinforcing portion 42 includes a plurality of bridge portions 41. The bridge portions 41 are arranged to have intervals therebetween in the circumferential direction of the substrate 25. As shown in FIG. 2, the bridge portions 41 are located at positions corresponding to the four corner portions 25c of the substrate 25 and vicinities of the corner portions 25c.

As shown in FIG. 3, each of the bridge portions 41 joints the outer peripheral edge 25d of the substrate 25 and the printed circuit board 20 to each other. Further, each of the bridge portions 41 has such a shape which widens from the outer peripheral edge 25d of the substrate 25 in the proceeding direction towards the printed circuit board 20.

The reinforcing members 40 includes a plurality of spacer portions 43 continuing to and integrated with the reinforcing portion 42. Each spacer 43 extends onto the second surface 25b of the substrate 25, and is set between the second surface 25b and the second region 30b of the heat sink 30.

As shown in FIG. 3, each spacer portion 43 includes a support portion 44. The height D2 of the support portion 44 is larger than the height D1 of the bare chip 27, and the heights of the support portions 44 are substantially the same as each other in all of the bridge portions 41. It should be noted that the support portions 44 shown in FIGS. 2 and 3 each have a flat surface, but they may have curved surfaces with substantially the same height D2.

Each of the spacer portions 43 maintains a gap g between the second region 30b and the substrate 25 as the support portion 44 supports the heat sink 30. Further, each of the spacer portion 43 maintains the gap between the first region 30a and the bare chip 27, as well, which is filled with the grease 31.

The BGA 22 is mounted on the printed circuit board 20, for example, in the following manner.

While the BGA 22 is placed on the conductor pattern of the printed circuit board 20, the solder balls 26 are fused by heat, and thus the BGA 22 is soldered to the printed circuit board 20. In this manner, the solder joint portions 28 are formed between the solder balls 26 and the conductor pattern of the printed circuit board 20. Thus, the BGA 22 and the printed circuit board 20 are electrically connected to each other via the solder joint portions 28.

The adhesive in paste state is applied in line to the second surface 25b of the substrate 25, the outer peripheral edge 25d of the substrate 25 and the printed circuit board 20 to be across each other. Here, the amount of the adhesive supplied is controlled such that the height D2 of the support portion 44 of the spacer portion 43 becomes larger than the height D1 of the bare chip even if the adhesive deforms as it cures. The adhesive is supplied to each of the positions corresponding to the four corner portions 25c of the substrate 25 and the vicinities of the corner portions 25c.

The supplied adhesive is heated to be cured. The heating temperature is lower than the melting point of the solder balls 26. The curing of the adhesive is not limited to thermosetting, but it may be of such a type as curing over time, or by the radiation of ultraviolet ray.

When the adhesive is cured, the reinforcing members 40 is formed. Next, the grease 31 is applied onto the bare chip 27, and the heat sink 30 is placed on the second surface 25b of the substrate 25 such as to cover the bare chip 27. The heat sink 30 is placed on the spacer portions 43 of the reinforcing members 40, and then it is secured to the printed circuit board 20 using, for example, screws or conventionally known cross-shaped spring. Thus, the work of mounting the BGA 22 to the printed circuit board 20 is completed.

Next, the advantageous effect of the portable computer 1 having the above-described structure will now be described.

The spacer portions 43 of the reinforcing members 40 are set between the second surface 25b of the substrate 25 and the heat sink 30 as a conventionally employed spacer-like exclusive member, and they support the heat sink 30.

As the spacer portions 43 support the heat sink 30, the gap g created between the second surface 25b and the second region 30b of the heat sink 30 is maintained, and a gap created between the bare chip 27 and the first region 30a of the heat sink 30 is maintained. With this structure, the spacer portions 43 exhibit a function similar to the conventional spacer, and thus the inclination of the heat sink 30 can be prevented. In this manner, the direct contact between the heat sink 30 and the bare chip 27 can be avoided, thereby making it possible to prevent the bare chip 27 from being damaged.

The spacer portions 43 is formed to be integrated with the reinforcing portions, respectively, by means of the adhesive for reinforcement. Thus, exclusive parts such as conventionally employed spacers to maintain the gap g is no longer required, and therefore the number of parts of the portable computer 1 can be decreased. Further, the spacer portions 43 are formed at the same time as the reinforcing portions 42, and therefore the work for mounting the parts of spacers is not longer required. As a result, the production cost for the portable computer 1 can be reduced.

Further, the heat sink 30 is placed on the spacer portions 43 formed of the cured adhesive. With this structure, the heat sink 30 can be easily removed from the BGA 22, thereby facilitating the maintenance work.

When the reinforcing members 40 is formed of a heat-proof adhesive, it is no longer necessary to remove the reinforcing members 40 when heating the printed circuit board 20 for, for example, dismounting electronic parts 23. In this manner, the increase in work steps for dismounting parts can be avoided.

Further, the reinforcing portions 42 for reinforcing the solder joint portions 28 between the BGA 22 and the printed circuit board 20 have spacer portions 43 which extend onto the second surface 25b of the printed circuit board 20. In other words, since the reinforcing members 40 extends even to the second surface 25b of the printed circuit board 20, a larger adhesion surface can be reserved between the reinforcing members 40 and the BGA 22 compared to the conventional cases. In this manner, the reinforcing members 40 can even more strongly reinforce the solder joint portions 28 between the solder balls 26 and the printed circuit board 20.

It should be noted that in the first embodiment, the heat sink 30 is placed on the second surface 25b of the substrate 25 after thermally curing the adhesive; however the procedure of the placement is not limited to this. For example, it is alternatively possible to place the heat sink 30 on the second surface 25b of the substrate 25 before thermally curing the adhesive.

In more detail, after soldering the solder balls 26 of the BGA 22 to the printed circuit board 20, the adhesive in paste state is applied in line to the second surface 25b of the substrate 25, the outer peripheral edge 25d of the substrate 25 and the printed circuit board 20 to be across each other.

Next, the grease 31 is applied to the bare chip 27, and the heat sink 30 is placed on the second surface 25b of the substrate 25 such as to cover the bare chip 27. The heat sink 30 is placed on the paste-state adhesive supplied on the second surface 25b, and thus the second region 30b of the heat sink 30 is brought into intimate contact with the adhesive before cured.

When the heat sink 30 is placed on the adhesive, it is adjusted such that the height D2 of the adhesive becomes larger than the height D1 of the bare chip. With this structure, a gap is created between the heat sink 30 and the bare chip 27 when the heat sink 30 is placed on the adhesive.

The supplied adhesive is heated to be cured. The adhesive is cured while in intimate contact with the second region 30b of the heat sink 30.

As described above, by placing the heat sink 30 on the adhesive before cured, the second region 30b of the heat sink 30 is adhered to the spacer portions 43 of the reinforcing members 40. In other words, the heat sink 30 is secured to the substrate 25 via the spacer portions 43 of the reinforcing members 40. With this structure, screws or cross-shaped spring for fixing the heat sink 30 is no longer required, thereby making it possible to decrease the number of parts.

Further, when supplying the adhesive, it is no longer necessary to adjust the height of the adhesive in consideration of deformation which may occur after being cured, and therefore the operation of supplying the adhesive can be easily carried out.

Next, the second to fifth embodiments of the present invention will now be described with reference to respective accompanying drawings. In these embodiments, structural parts which have the same functions as those of the portable computer 1 of the first embodiment will be designated by the same reference numerals, and the explanations therefore will be omitted.

Figure 4:
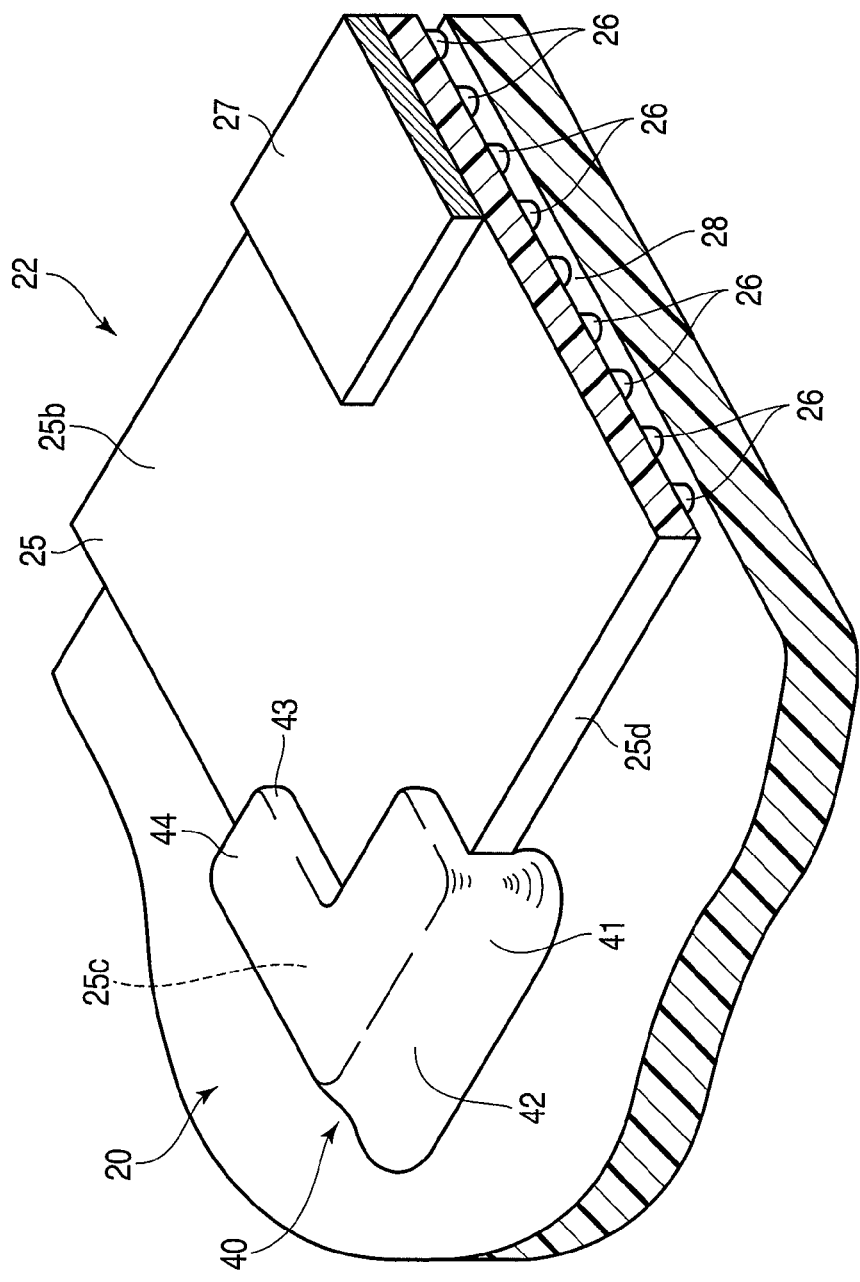
FIG. 4 is an exemplary partial perspective view of a BGA mounted on the printed circuit board in the second embodiment.

The second embodiment of the present invention will now be described with reference to FIG. 4.

In the second embodiment, the reinforcing members 40 is provided to be continuous along the corner portions 25c of the substrate 25 and both sides which interpose the corner portion 25c. It should be noted that the structure of the reinforcing members 40 is not limited to that provided for a portion of the outer circumference of the substrate 25 as shown in FIG. 4, but the reinforcing members 40 may be provided over the entire circumference of the substrate 25.

The reinforcing members 40 may be formed by a plurality of supplying operations. For example, the operation of supplying the adhesive for forming the reinforcing portions 42 to the outer peripheral edge 25d of the substrate 25 and the printed circuit board 20 such as to be across each other, and the operation of supplying the adhesive for forming the spacer portions 43 to the second surface 25b may be carried out separately.

Figure 5:
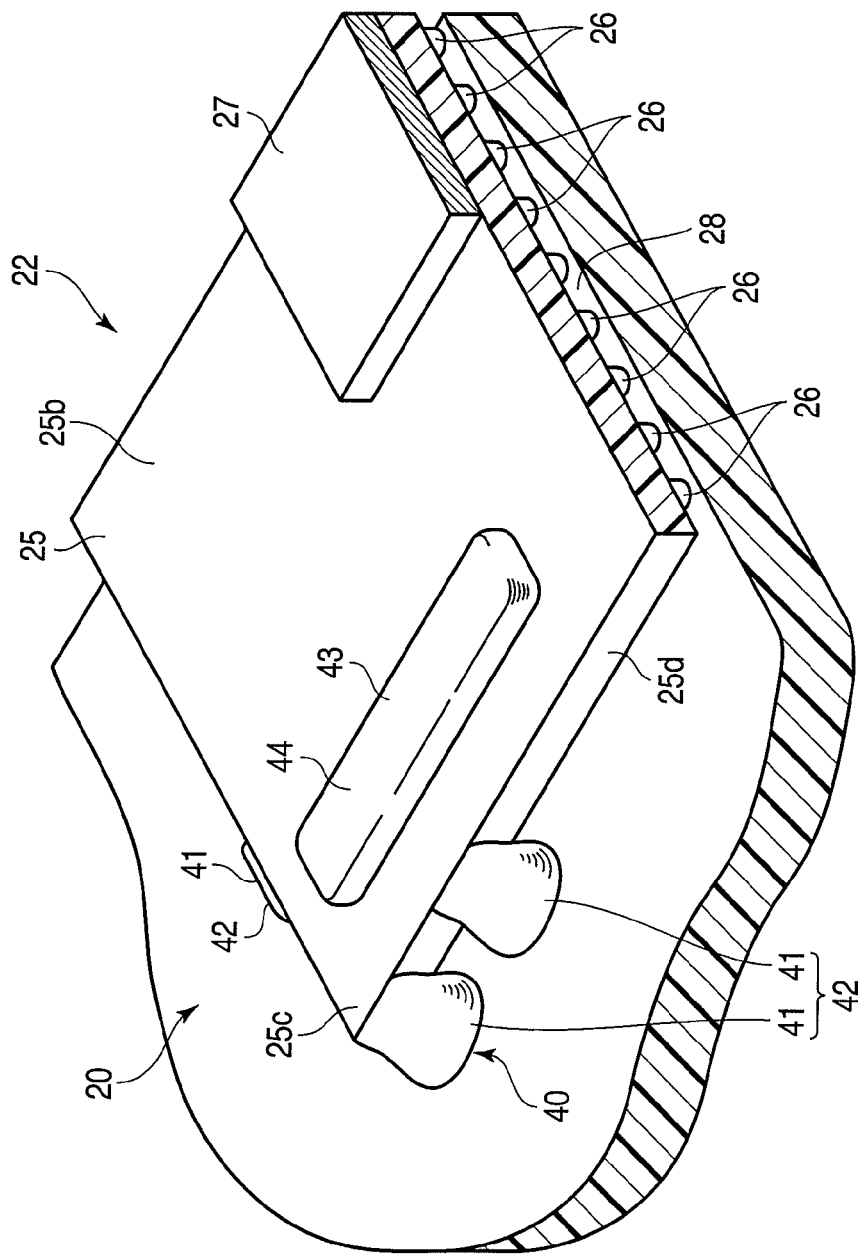
FIG. 5 is an exemplary partial perspective view of a BGA mounted on the printed circuit board in the third embodiment.

Next, the third embodiment of the present invention will now be described with reference to FIG. 5.

In the third embodiment, the reinforcing members 40 include reinforcing portions 42 and spacer portions 43 provided to be independent from the respective reinforcing portions 42.

Each of the reinforcing portions 42 is formed by supplying the adhesive to the outer peripheral portion 25d of the substrate 25 and the printed circuit board 20 such as to be across each other. Each of the spacer portions 43 is formed by supplying the adhesive onto the second surface 25b. It should be noted that in FIG. 5, the spacer portion 43 is formed in line, but it may be formed in dot, or formed into a bent shape.

Since the spacer portions 43 are formed to be independent from the respective reinforcing portions 42, the layout of the spacer portions 43 can be freely designed.

Next, the fourth embodiment of the present invention will now be described with reference to FIG. 6.

According to the fourth embodiment, a pin grid array (PGA) 51, which is an example of the surface mount parts, is mounted on the printed circuit board 20. The PGA 51 includes a first surface 51a and a plurality of pin-shaped connection terminals 52. The first surface 51a faces the printed circuit board 20. The connection terminals 52 are all arranged on the first surface 51a and soldered to the printed circuit board 20.

It should be noted that the surface mount part of the fourth embodiment is not limited to the PGA 51. Further, as long as the connection terminals are arranged on a surface which faces the printed circuit board 20, a surface mount part of such a type that the connection terminals has some other shape than the pin-form can be applied.

Next, the fifth embodiment of the present invention will now be described with reference to FIG. 7.

According to the fifth embodiment, a quad flat package (QFP) 55, which is an example of the surface mount parts, is mounted on the printed circuit board 20. The QFP 55 includes a plurality of connection terminals 56 in the outer peripheral edge of a main body 55a of the package. The connection terminals 56 overhang outwards from the main body 55a of the package without entering between the main body 55a of the package and the printed circuit board 20. The tip ends of the connection terminals 56 are soldered to the conductive pattern of the printed circuit board 20.

The reinforcing portions 42 of the reinforcing members 40 are formed by supplying the paste-state adhesive to the outer peripheral edge of the main body 55a of the package and the printed circuit board 20 such as to be across each other. The reinforcing portions 42 reinforce the solder joint portions 57 between the connection terminals 56 and the conductive pattern of the printed circuit board 20.

The spacer portions 43 of the reinforcing members 40 are formed to be continuous to the respective reinforcing portions 42. The spacer portions 43 are set between the QFP 55 and the heat sink 30 so as to support the heat sink 30.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
   a housing;
   a printed circuit board contained in the housing; and
   a surface mount part mounted on the printed circuit board, the surface mount part comprising,
   a substrate comprising a first surface facing the printed circuit board, and a second surface opposite to the first surface;
   a plurality of connection terminals arranged on the first surface of the substrate and soldered to the printed circuit board;
   a chip mounted on the second surface of the substrate;
   a cooler arranged to face the second surface of the substrate and cover the chip, the cooler being thermally connected to the chip; and
   reinforcing modules configured to reinforce solder joint portions between the connection terminals and the printed circuit board, the reinforcing modules being structured by providing an adhesive across an outer peripheral edge of the substrate and the printed circuit board and comprising spacer portions interposed between the second surface of the substrate and the cooler and configured to support the cooler,
   wherein the cooler comprises a first region facing the chip and a second region around the first region and facing the second surface of the substrate, and the spacer portions maintain a gap between the second region of the cooler and the substrate.

2. The electronic device of claim 1, wherein the reinforcing modules comprise reinforcing portions configured to attach the outer peripheral edge of the substrate to the printed circuit board, and the spacer portions are continuous to the respective reinforcing portions.

3. The electronic device of claim 2, further comprising:
   a grease having a thermal conductivity filled between the chip and the cooler.

4. The electronic device of claim 2, wherein the reinforcing portions comprise a plurality of bridges arranged in a circumferential direction of the substrate with intervals therebetween.

5. The electronic device of claim 3, wherein the reinforcing portions are shaped to be broader from the outer peripheral edge of the substrate towards the printed circuit board.

6. The electronic device of claim 1, wherein the substrate comprises a plurality of corner portions and the reinforcing portions are arranged at positions corresponding to the corner portions.

7. The electronic device of claim 1, wherein the cooler is attached to the substrate via the spacer portions of the reinforcing modules.

* * * * *